US007771204B2

(12) United States Patent
Stoyan

(10) Patent No.: US 7,771,204 B2
(45) Date of Patent: Aug. 10, 2010

(54) LIGHT-EMITTING SYSTEM WITH A PLUG CONNECTION

(75) Inventor: Harald Stoyan, Regensburg (DE)

(73) Assignee: Osram Gesellschaft mit beschränkter Haftung, Muniche (DE)

( * ) Notice: Subject to any disclaimer, the term of this patent is extended or adjusted under 35 U.S.C. 154(b) by 41 days.

(21) Appl. No.: 12/214,330

(22) Filed: Jun. 18, 2008

(65) Prior Publication Data

US 2009/0011618 A1 Jan. 8, 2009

(30) Foreign Application Priority Data

Jun. 18, 2007 (DE) ...................... 10 2007 028 463

(51) Int. Cl.
*H01R 12/00* (2006.01)

(52) U.S. Cl. ........................................................ 439/56

(58) Field of Classification Search .................. 439/56, 439/459–496; 362/252, 237, 244

See application file for complete search history.

(56) References Cited

U.S. PATENT DOCUMENTS 4,173,035 A 10/1979 Hoyt
5,559,681 A * 9/1996 Duarte ....................... 362/231
2005/0176288 A1* 8/2005 Ohsawa et al. .............. 439/495

FOREIGN PATENT DOCUMENTS

DE 201 13 287 2/2002

OTHER PUBLICATIONS

Office Action dated Jun. 16, 2008 issued for the corresponding German Patent Application No. 10 2007 028 463.4-34 (4 pages).

* cited by examiner

*Primary Examiner*—Jean F Duverne
(74) *Attorney, Agent, or Firm*—Cohen Pontani Lieberman & Pavane

(57) ABSTRACT

A light-emitting system is provided, in which a flexible printed circuit (2) is connected to a plug connection (4) which connects the flexible printed circuit (2) either to a power source or to a second flexible printed circuit (20). The connection of the flexible printed circuit to a second printed circuit or to a power source can be made easily, and can be produced in large quantities.

16 Claims, 4 Drawing Sheets

1
2
3
4
5
6
8
9
11
12

1
2
3
4
5
13
14
15
16
17

LIGHT-EMITTING SYSTEM WITH A PLUG CONNECTION

RELATED APPLICATIONS

This application claims the priority of German application no. 10 2007 028 463.4 filed Jun. 18, 2007. The entire content of which is hereby incorporated by reference.

FIELD OF THE INVENTION

The invention relates to a light-emitting system that has a plug connection which allows connection to a power source or between flexible printed circuits.

SUMMARY OF THE INVENTION

One object of the present invention is to provide a light-emitting system in which flexible printed circuits, on which at least one light-emitting apparatus is provided, can be electrically conductively connected to one another, or flexible printed circuits having at least one light-emitting apparatus can be brought into electrically conductive contact with a power source. Another object is to provide a light-emitting system such as this that is capable of being produced as easily as possible, and that is suitable for mass production.

These and other objects are attained in accordance with one aspect of the invention directed to a light-emitting system that has a first flexible printed circuit on which at least one first light-emitting apparatus is arranged. By way of example, a flexible printed circuit may have a bending radius of $\leqq$20 cm, in particular of a few mm, and a thickness of $\leqq$0.5 mm, in particular $\leqq$0.3 mm. The first flexible printed circuit has a first contact area for electrical linking to a first plug connection. The light-emitting system also comprises a first plug connection, into which the first contact area of the first flexible printed circuit can be inserted, wherein the plug connection is either electrically conductively connected to at least one supply line for connection to a power source, or is electrically conductively connected to a second plug connection. In this case, the first plug connection and the at least one supply line or the first and the second plug connection are formed integrally. By way of example, integrally can mean that the first plug connection and the at least one supply line or the first and the second plug connection form a single module which can connect the first flexible printed circuit, on which at least one first light-emitting apparatus is provided, to the power source or to a second flexible printed circuit. The use of a module such as this as an integral component avoids the need for complex process steps such as soldering the supply line directly to the first flexible printed circuit. The first flexible printed circuit can thus be connected directly to a power source or a further, second flexible printed circuit, without any additional tool.

The light-emitting apparatus on the flexible printed circuit may comprise a light-emitting diode. The light-emitting diode may, for example, be an organic or inorganic light-emitting diode or a thin-film semiconductor chip. Furthermore, a plurality of light-emitting diodes may be provided or else further components such as transistors or resistors, an appropriate number of which can be fitted to the first flexible printed circuit, depending on the purpose of the light-emitting system.

In particular, thin-film semiconductor chips are distinguished by at least one of the following characteristic features:

a reflective layer is applied or formed on a first main surface, facing a mount, of an epitaxial layer sequence which produces radiation, and this reflective layer reflects at least a portion of the electromagnetic radiation produced in the epitaxial layer sequence back into it;

the epitaxial layer sequence has a thickness in the region of 20 μm or less, in particular in the region of 10 μm; and the epitaxial layer sequence contains at least one semiconductor layer with at least one surface which has a mixing structure which ideally leads to an approximately ergodic distribution of the radiation in the epitaxial layer sequence, that is to say it has a scattering behavior which is as ergodically stochastic as possible.

Furthermore, the first contact area of the first flexible printed circuit can be mechanically fixed in the first plug connection. The plug connection may comprise an FFC (flat flex cable) plug or a ZIF (zero insertion force) plug, which makes it possible to insert the flexible printed circuit into the plug without application of any force, and to fix it there. The flexible printed circuit (FPC) which may be a flexible flat cable (FFC) is thus mounted in the plug connection without any force being applied. In this case, there is no need for soldering or other fixing. Since the first contact area of the first flexible printed circuit is fixed in the first plug connection, the electrical connection is made between the at least one light-emitting apparatus, which is located on the first flexible printed circuit, and the first plug connection, therefore allowing the first light-emitting apparatus on the first flexible printed circuit to be electrically linked to a light-emitting apparatus on a second flexible printed circuit, or to a power source.

The first and the second plug connection may each comprise a solder projection. A solder projection may, for example, comprise solder legs, with these solder legs being easily accessible such that mating pieces can be soldered to them.

In a further embodiment, an electrically conductive substrate is provided, to which the solder projections of the first and second plug connection are soldered. This results in an electrical contact being made between the first and the second plug connection. Furthermore, an electrically non-conductive substrate can also be used, on which electrically conductive connections, for example in the form of wiring, are provided, which electrically conductively connect the solder projections of the first and second plug connection to one another. The substrate may comprise circuit mounts, for example FFC (flexible flat cable), FPC (flexible printed circuit) or PCB (printed circuit board) circuit mounts.

Furthermore, an electrically conductive substrate may be provided, and the supply line for connection to a power source may have an end piece. The solder projection of the first plug connection and the end piece of the supply line can be soldered to the electrically conductive substrate. It is also possible to use an electrically non-conductive substrate with electrically conductive wiring. An electrically conductive connection is therefore made between the first plug connection and the supply line, thus making it possible to produce an electrically conductive connection between the at least one light-emitting apparatus on the first printed circuit and a power source.

In a further embodiment, the end piece of the supply line and the solder projection of the first plug connection can be soldered to one another. This embodiment saves a soldering process and the use of a substrate.

Furthermore, a second flexible printed circuit may be provided with a second contact area on which at least one second light-emitting apparatus is arranged. In this case, the second plug connection is provided, in which the second contact area of the second flexible printed circuit can be mechanically fixed. The first flexible printed circuit, on which at least one first light-emitting apparatus is provided, is therefore electrically conductively connected by means of the first and second plug connection to the second flexible printed circuit, on which at least one second light-emitting apparatus is provided.

The light-emitting apparatus of the second flexible printed circuit may comprise a light-emitting diode. Furthermore, further components may be fitted to the second flexible printed circuit, for example transistors or resistors.

Furthermore, at least parts of the first plug connection and at least parts of the end piece of the supply line or at least parts of the first plug connection, the substrate and at least parts of the end piece of the supply line may be surrounded by encapsulation. The encapsulation may be composed of a material which is chosen from a group which comprises thermoplastics or thermosetting plastics. The melting temperature of the encapsulation may be ≧180° C. The encapsulation is used for mechanical fixing and robustness of the first plug connection, of the end piece of the supply line and if appropriate of the substrate, so that this results in an integral embodiment of the first plug connection, of the substrate and of the supply line. All these elements form a closed functional unit.

Furthermore, at least parts of the first plug connection, the substrate and at least parts of the second plug connection may be surrounded by encapsulation. The first plug connection, the substrate and the second plug connection therefore also form a mechanical unit, and are formed integrally.

This results in a light-emitting system in which a first light-emitting apparatus on a first flexible printed circuit can be connected in a simple manner by means of a plug connection to a power source or to a second flexible printed circuit with a light-emitting apparatus. The integral embodiment of the first plug connection, of the substrate and of the second plug connection or of the first plug connection, of the substrate and of the supply line, or of the first plug connection and the supply line allows light-emitting apparatuses on flexible printed circuits to be connected to one another quickly and without complication, or the capability to connect a light-emitting apparatus on a flexible printed circuit to a power source without complication.

The supply lines used for this purpose may comprise cables, for example round cables, braids or flat ribbon cables.

Specific embodiments of the invention will be explained in more detail in the following text with reference to the figures.

DETAILED DESCRIPTION OF THE DRAWINGS

Figure 1:
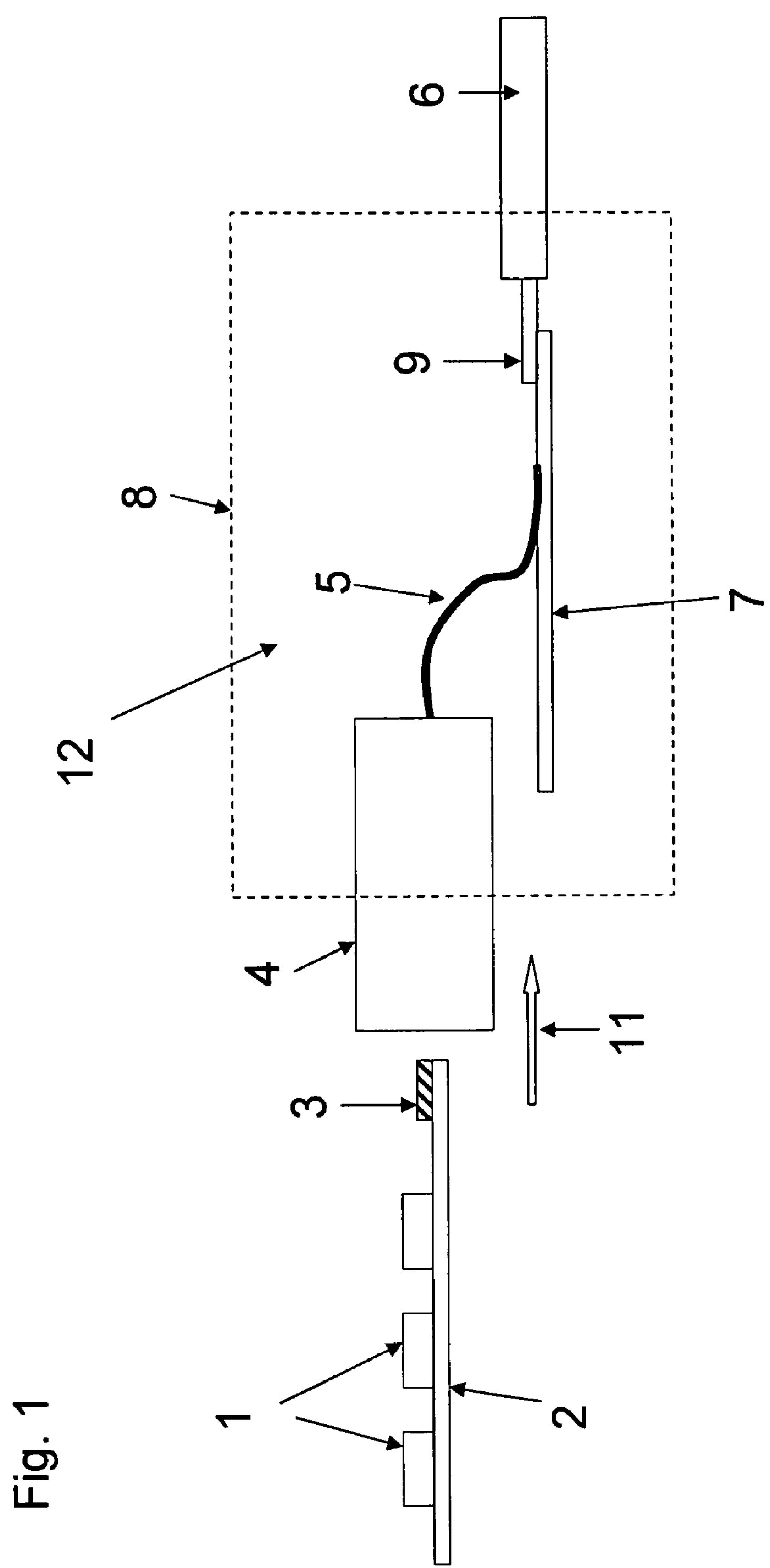
FIG. 1 shows the connection of light-emitting apparatuses on a first flexible printed circuit to a power source.

FIG. 1 shows an embodiment of the invention for connection of a flexible printed circuit 2 to a supply line 6 for connection to a power source. At least one light-emitting apparatus 1 is provided on the flexible printed circuit 2 and, for example, comprises a light-emitting diode. Furthermore, a contact area 3 is provided, and it can be inserted into a first plug connection 4. The flexible printed circuit 2 can be inserted into the plug connection 4 in the direction of the arrow 11, and can be mechanically fixed there. The plug connection 4 also has a solder projection 5 which, together with the end piece 9 of the supply line 6, is soldered on an electrically conductive substrate 7. The substrate 7 may also be electrically non-conductive, but then has electrically conductive connections, for example wiring (not shown here) which electrically conductively connects the solder projection 5 and the end piece 9 to one another. The plug connection 4, the substrate 7 and the supply line 6 are surrounded by encapsulation 8, which connects the elements just mentioned to one another in a mechanically robust form, thus resulting in a module 12 to which the flexible printed circuit 2 is connected.

Figure 2:
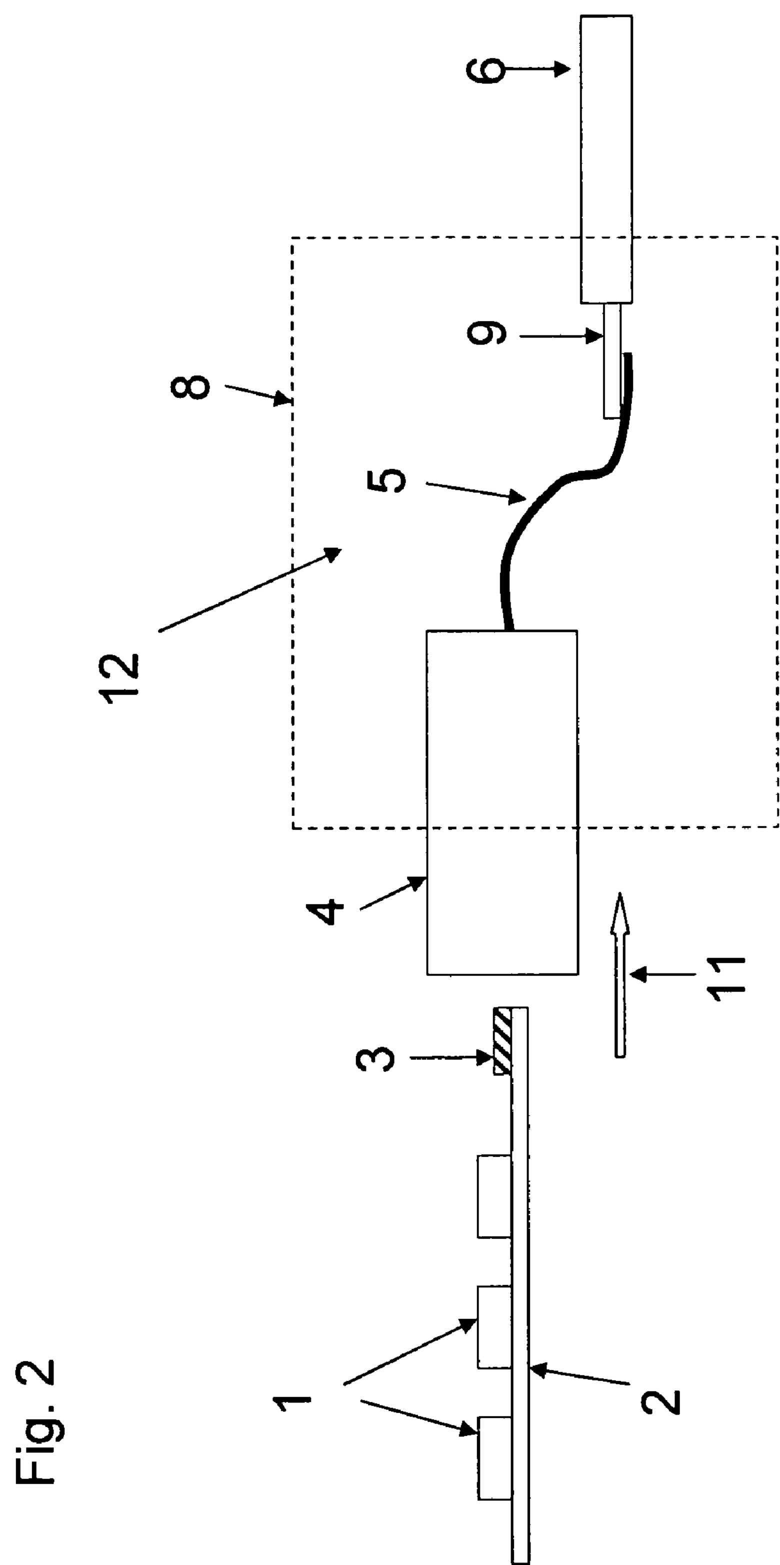
FIG. 2 shows a further embodiment of the connection of light-emitting apparatuses on a first flexible printed circuit to a power source.

FIG. 2 shows the flexible printed circuit 2 linked to a supply line 6 for connection to a power source. The reference symbols and the design correspond to the embodiment shown in FIG. 1, with the difference that no substrate 7 is used. In the embodiment in FIG. 2, the solder projection 5 and the end piece 9 are directly soldered to one another. There is no need to use the substrate 7 and a soldering process is saved. In this case as well, at least parts of the first plug connection 4 and of the supply line 6 are mechanically fixed to one another by means of encapsulation 8, thus resulting in the module 12.

Figure 3:
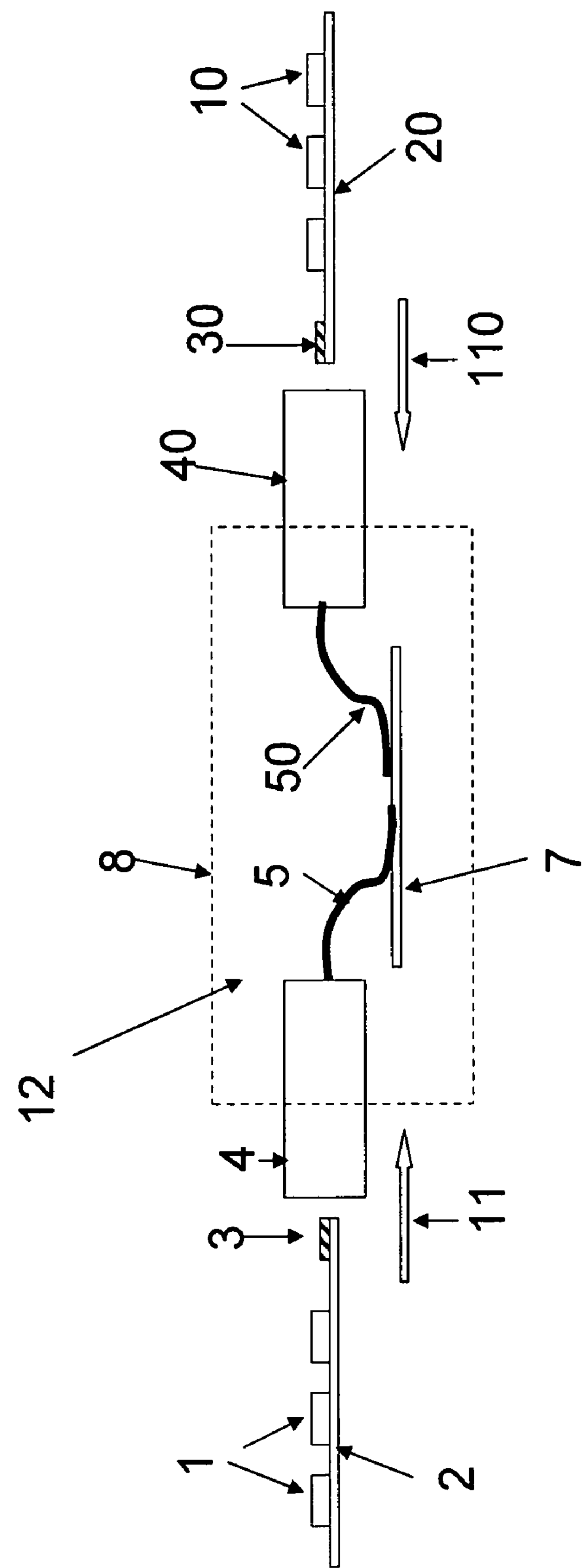
FIG. 3 shows the connection of two flexible printed circuits to light-emitting apparatuses.

FIG. 3 shows a further embodiment of the light-emitting system. In this case, a first and a second flexible printed circuit 2 and 20 are connected to one another. The two printed circuits each comprise at least one light-emitting apparatus 1 and 10 which, for example, may be light-emitting diodes. Furthermore, both flexible printed circuits comprise a contact area 3 and 30 which can be inserted into a first plug connection 4 and a second plug connection 40, and are mechanically fixed there. The insertion direction is in each case indicated by the arrows 11 and 110. The first and second 40 plug connections 4 and 40 each have a respective solder projection 5 and 50, with the solder projections being soldered onto a substrate 7. The substrate 7 is either electrically conductive, so that the solder projections are electrically conductively connected to one another, or the substrate has electrically conductive wiring, which makes the electrical connection. The first and second plug connections 4, 40 and the substrate 7 are surrounded by encapsulation 8, which mechanically fixes the plug connections to one another thus resulting in a module 12 as a separate integral component, which connects the first 2 and the second 20 printed circuits to one another.

Figure 4:
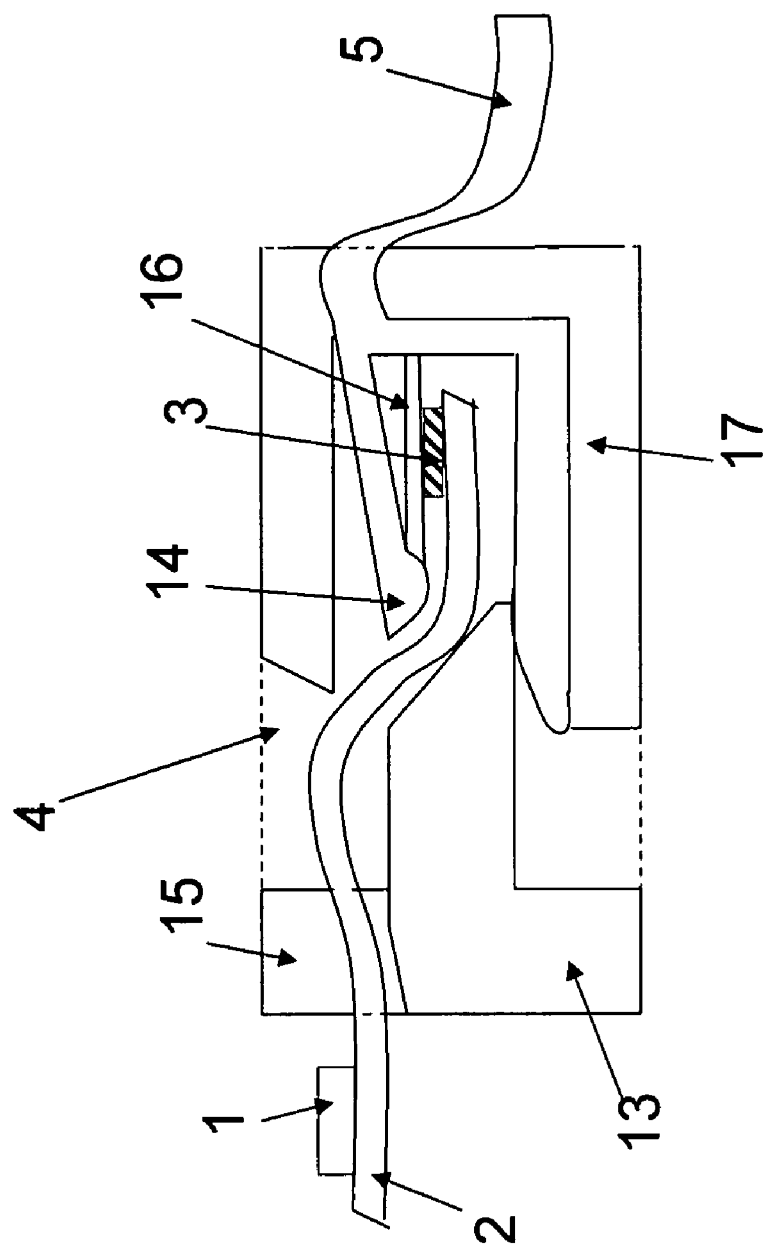
FIG. 4 shows the mechanical fixing of the contact area of a flexible printed circuit in a plug connection.

FIG. 4 shows, schematically, a contact area 3 of a flexible printed circuit 2, which is mechanically fixed in a plug connection 4. The plug connection 4 comprises a pushing wedge 13 and a housing 17. A moving lock 14 is arranged in the housing 17. Pushing wedge 13 and housing 17 can be separate parts. The mechanical fixing takes place between pushing wedge 13 and lock 14. The flexible printed circuit 2, to which a light-emitting apparatus 1 is fitted, is pushed into the interior of the plug connection with pushing wedge 13 which is moved manually by means of a pushing portion 15. When the flexible printed circuit 2, which has a contact area 3, is located in the correct position, the moving lock 14 fixes the printed circuit in this position. During this process, the contact area 3 is pushed onto the metal contact 16. Metal contact 16 can be, for example, a planar sheet of metal or a metal braid. In a further exemplary embodiment, the contact area 3 may, for example, also be pressed directly onto the lock 14, when there is no metal braid. The lock 14 and the solder projection 5 are formed integrally, and are electrically conductive, in this embodiment. This results in an electrically conductive contact being made between the contact area 3, the metal braid 16 and the solder projection 5 or, in a further embodiment, directly between the contact area 3 and the solder projection 5.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A light-emitting system comprising:

an electrically conductive substrate;

a first flexible printed circuit on which at least one first light-emitting apparatus is arranged and which has a first contact area for electrical linking to a first plug connection; and a first plug connection into which the first contact area of the first flexible printed circuit can be inserted;

wherein the first plug connection is electrically conductively connected to a second plug connection;

wherein the first and the second plug connection are formed integrally;

wherein the first and second plug connections comprise respective solder projections; and wherein the solder projections of the first and second plug connections are soldered to the electrically conductive substrate.

2. The light-emitting system as claimed in claim 1, wherein the at least one light-emitting apparatus comprises a light-emitting diode.

3. The light-emitting system as claimed in claim 1, wherein the first contact area of the first flexible printed circuit is mechanically fixed in the first plug connection.

4. The light-emitting system as claimed in claim 1, comprising a second flexible printed circuit on which at least one second light-emitting apparatus is arranged, wherein the second flexible printed circuit is mechanically fixed in the second plug connection.

5. The light-emitting system as claimed in claim 1, further comprising a supply line, which is electrically conductively connected to the first plug connection and includes an end piece, wherein at least parts of the first plug connection, and at least parts of the end piece of the supply line are surrounded by encapsulation.

6. The light-emitting system as claimed in claim 1, wherein at least parts of the first plug connection, the conductive substrate and at least parts of the second plug connection are surrounded by encapsulation.

7. A light-emitting system comprising:

a first flexible printed circuit on which at least one first light-emitting apparatus is arranged and which has a first contact area for electrical linking to a first plug connection;

a first plug connection into which the first contact area of the first flexible printed circuit can be inserted, the first plug connection comprising a solder projection; and a conductive substrate;

wherein the first plug connection is electrically conductively connected to at least one supply line for connection to a power source, the at least one supply line having an end piece;

wherein the first plug connection and the at least one supply line are formed integrally; and wherein the solder projection of the first plug connection and the end piece of the at least one supply line are soldered to the conductive substrate.

8. The light-emitting system as claimed in claim 7, wherein at least parts of the first plug connection, the conductive substrate and at least parts of the end piece of the supply line are surrounded by encapsulation.

9. The light-emitting system as claimed in claim 7, wherein at least parts of the first plug connection and at least parts of the end piece of the at least one supply line are surrounded by encapsulation.

10. The light-emitting system as claimed in claim 7, wherein at least parts of the first plug connection, the conductive substrate and at least parts of the end piece of the at least one supply line are surrounded by encapsulation.

11. A light-emitting system comprising:

a first flexible printed circuit on which at least one first light-emitting apparatus is arranged and which has a first contact area for electrical linking to a first plug connection; and a first plug connection into which the first contact area of the first flexible printed circuit can be inserted, the first plug connection comprising a solder projection;

wherein the first plug connection is electrically conductively connected to at least one supply line for connection to a power source, the at least one supply line having an end piece;

wherein the first plug connection and the at least one supply line are formed integrally; and wherein the solder projection of the first plug connection and the end piece of the supply line are soldered to one another.

12. The light-emitting system as claimed in claim 11, wherein at least parts of the first plug connection, and at least parts of the end piece of the supply line are surrounded by encapsulation.

13. The light-emitting system as claimed in claim 11, wherein at least parts of the first plug connection, the conductive substrate and at least parts of the end piece of the supply line are surrounded by encapsulation.

14. The light-emitting system as claimed in claim 11, wherein at least parts of the first plug connection and at least parts of the end piece of the supply line are surrounded by encapsulation.

15. The light-emitting system as claimed in claim 11, further comprising a conductive substrate, wherein at least parts of the first plug connection, the conductive substrate and at least parts of the end piece of the supply line are surrounded by encapsulation.

16. The light-emitting system as claimed in claim 11, wherein the first contact area of the first flexible printed circuit is mechanically fixed in the first plug connection.

* * * * *